(12) United States Patent
Ramappa

(10) Patent No.: US 8,586,460 B2
(45) Date of Patent: Nov. 19, 2013

(54) CONTROLLING LASER ANNEALED JUNCTION DEPTH BY IMPLANT MODIFICATION

(75) Inventor: Deepak Ramappa, Cambridge, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 83 days.

(21) Appl. No.: 13/238,734

(22) Filed: Sep. 21, 2011

(65) Prior Publication Data

US 2012/0077305 A1    Mar. 29, 2012

Related U.S. Application Data

(60) Provisional application No. 61/385,770, filed on Sep. 23, 2010.

(51) Int. Cl.
*H01L 21/26* (2006.01)
*H01L 21/42* (2006.01)

(52) U.S. Cl.
USPC ........... 438/513; 438/514; 438/166; 438/535; 438/45; 438/510; 250/492.21; 250/492.2; 250/426; 250/492.1; 250/251; 250/492.23

(58) Field of Classification Search
USPC ........... 438/513, 514, 166, 535, 45, 510, 795, 438/16, 280, 305, 780; 250/492.21, 92.2, 250/426, 492.1, 251, 492.23
See application file for complete search history.

(56) References Cited

U.S. PATENT DOCUMENTS

| | | | |
|---|---|---|---|
| 6,380,044 B1 * | 4/2002 | Talwar et al. | 438/308 |
| 6,645,838 B1 | 11/2003 | Talwar et al. | |
| 6,743,689 B1 | 6/2004 | Paton et al. | |
| 2004/0245583 A1 | 12/2004 | Horiuchi et al. | |
| 2008/0044938 A1 * | 2/2008 | England et al. | 438/51 |
| 2009/0227095 A1 * | 9/2009 | Bateman et al. | 438/514 |
| 2010/0279479 A1 * | 11/2010 | Hatem et al. | 438/300 |

FOREIGN PATENT DOCUMENTS

WO        0180300 A1    10/2001
WO    2010039807 A2    4/2010

OTHER PUBLICATIONS

Shima, A., et al., Self-limiting Laser Thermal Process for Ultra-shallow Junction Formation of 50-nm Gate CMOS, Technical Digest—International Electron Devices Meeting 2003, Dec. 8, 2003, pp. 493-496, IEEE, New York, New York, US.
Aw, S.E., et al, Optical absorption measurements of band-gap shrinkage in moderately and heavily doped silicon, J. Phys.: Condens. Matter 3, 1991, pp. 8213-8223, IOP Publishing Ltd., UK.
White, C.W., et al, Laser Annealing of Ion Implanted Silicon, Laser-Solid Interactions and Laser Processing Symposium, Boston, MA, Nov. 1978, U.S. Department of Energy.

* cited by examiner

*Primary Examiner* — Telly Green

(57) ABSTRACT

Methods of enabling the use of high wavelength lasers to create shallow melt junctions are disclosed. In some embodiments, the substrate may be preamorphized to change its absorption characteristics prior to the implantation of a dopant. In other embodiments, a single implant may serve to amorphize the substrate and provide dopant. Once the substrate is sufficiently amorphized, a laser melt anneal may be performed. Due to the changes in the absorption characteristics of the substrate, longer wavelength lasers may be used for the anneal, thereby reducing cost.

6 Claims, 9 Drawing Sheets

CONTROLLING LASER ANNEALED JUNCTION DEPTH BY IMPLANT MODIFICATION

This application claims priority of U.S. Provisional Patent Application Ser. No. 61/385,770, filed Sep. 23, 2010, the disclosure of which is incorporated herein by reference in its entirety.

FIELD

This invention relates to laser annealing and, more particularly, to laser melt annealing of implanted workpieces.

BACKGROUND

An ion implanter includes an ion source for converting a gas or a solid material into a well-defined ion beam. The ion beam typically is mass analyzed to eliminate undesired ion species, accelerated to a desired energy, and implanted into a target. The ion beam may be distributed over the target area by electrostatic or magnetic beam scanning, by target movement, or by a combination of beam scanning and target movement. The ion beam may be a spot beam or a ribbon beam having a long dimension and a short dimension.

Laser annealing or laser melt annealing may be used to infuse dopants from the ion beam into a workpiece or activate a dopant from the ion beam to form junctions in a workpiece. This workpiece may be, for example, a semiconductor wafer or a solar cell. There are many ways a dopant may be incorporated into the workpiece.

First, solid source drive-in may be used. In this case, the dopant is a solid source at the surface of the workpiece and is driven into the workpiece. Laser energy is absorbed in the surface solid source and is thermally driven into the workpiece below. In some instances, the laser energy also is absorbed in the workpiece and aids diffusion of the dopant into the workpiece and incorporation the dopant.

Second, solid source melt annealing may be used. This is similar to the previous technique in that the dopant is a solid source at the surface of the workpiece. However, in this scenario, the laser energy is sufficient so that the dopant is thermally melted into the workpiece below. Laser energy is absorbed in the solid source and also the workpiece. This embodiment may involve intermixing the melted areas to incorporate the dopant.

Third, implanted source activated annealing may be used. In this scenario, the dopant is implanted into the workpiece, such as using an ion beam or plasma processing apparatus, and then the laser energy is absorbed in the workpiece to thermally activate the dopant or incorporate the dopant into the workpiece.

Fourth, implanted source melt annealing may be used. This is similar to the previous technique in that the dopant is implanted into the workpiece using an ion beam or a plasma processing apparatus. Laser energy of a sufficient energy is absorbed into the workpiece to thermally melt the workpiece so that the dopant and workpiece are mixed together and recrystallize together.

Laser energy absorption is one factor that affects annealing or melting to form junctions. Absorption properties of the silicon workpiece dictate the type or wavelength of the laser used to melt or anneal. FIG. 1 is a chart illustrating absorption depth of silicon versus wavelength of a laser. To form junctions with a depth of approximately 1 µm, short lasers such as excimer lasers are typically used. For thin workpieces, such as those <200 µm in thickness, many lasers with higher wavelengths (e.g., >400 nm lasers such as 850 nm diode, 1.06 µm YAG, 10.6 µm, CW lasers, fiber lasers) may not be absorbed in the workpiece because the workpieces may be transparent to the wavelength. Thus, such lasers may not be appropriate to melt junctions in these workpieces.

Forming junctions through melting has several advantages for workpieces including solar cells. Melting enables lowest resistivity for a given dopant density and the highest possible activation. In some cases, 100% activation may be achieved. Shallow and abrupt junctions may be formed and there may be less dopant loss due to segregation. Thermal budget is reduced for the rest of the workpiece because this remainder of the workpiece is not at silicon melt temperatures. Thus, workpiece quality degradation due to an increase in thermal budget is avoided. Furthermore, if the workpiece is a solar cell, different solar cell architectures may be enabled.

Laser melt anneals typically use short wavelength lasers such as excimer or ruby lasers. Junction depths are controlled by increasing incident laser power density, which may introduce damage into the workpiece. These short wavelength lasers, however, may be too expensive for use in manufacturing. Using lasers of longer or higher wavelengths would be more economical. FIG. 2 is a chart illustrating cost of ownership (CoO) and cost of consumables (CoC) versus wavelength. Longer wavelengths are comparatively less expensive and cheaper to maintain. Accordingly, there is a need in the art for a method that uses longer wavelength lasers to form shallow melt junctions.

SUMMARY

Methods of enabling the use of high wavelength lasers to create shallow melt junctions are disclosed. In some embodiments, the substrate may be preamorphized to change its absorption characteristics prior to the implantation of a dopant. In other embodiments, a single implant may serve to amorphize the substrate and provide dopant. Once the substrate is sufficiently amorphized, a laser melt anneal may be performed. Due to the changes in the absorption characteristics of the substrate, longer wavelength lasers may be used for the anneal, thereby reducing cost.

BRIEF DESCRIPTION OF THE DRAWINGS

For a better understanding of the present disclosure, reference is made to the accompanying drawings, which are incorporated herein by reference and in which.

DETAILED DESCRIPTION

The method is described herein in connection with a beam-line ion implanter. However, the method can be used with plasma doping, plasma immersion, flood implanter, or other ion implantation systems and processes. The embodiments disclosed herein may apply to implanted ions, forming a junction with a solid dopant sources on the surface, or a combination of these two. Thus, the invention is not limited to the specific embodiments described below.

Figure 1:
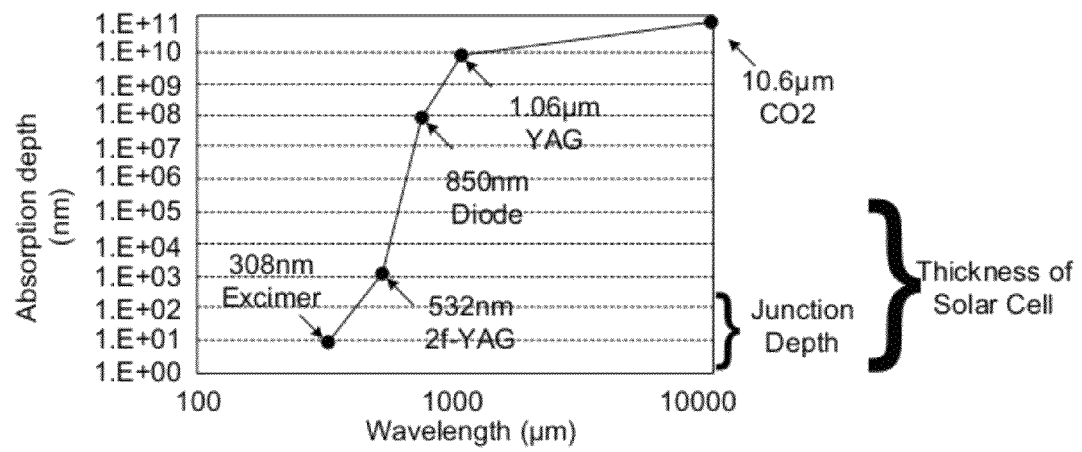
FIG. 1 is a chart illustrating absorption depth versus wavelength.
Figure 2:
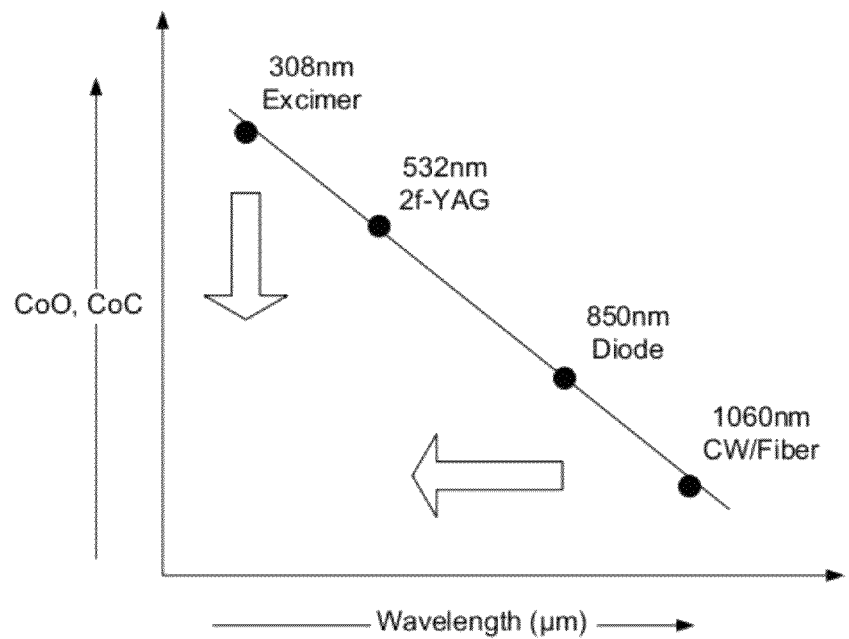
FIG. 2 is a chart illustrating cost of ownership and cost of consumables versus wavelength.
Figure 3:
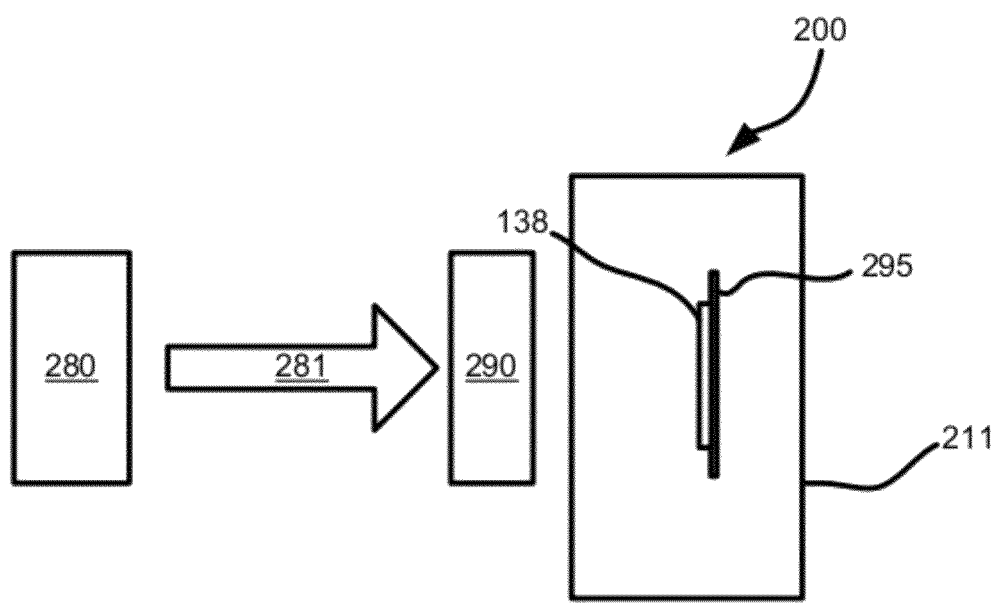
FIG. 3 is a simplified block diagram of a beam-line ion implanter.

FIG. 3 is a simplified block diagram of a beam-line ion implanter. Those skilled in the art will recognize that the beam-line ion implanter 200 is only one of many examples of differing beam-line ion implanters. In general, the beam-line ion implanter 200 includes an ion source 280 to generate ions that are extracted to form an ion beam 281, which may be, for example, a ribbon beam or a spot beam. The ion beam 281 may be mass analyzed and converted from a diverging ion beam to a ribbon ion beam with substantially parallel ion trajectories in one instance. The beam-line ion implanter 200 may further include an acceleration or deceleration unit 290 in some embodiments.

An end station 211 supports one or more workpieces, such as the workpiece 138, in the path of the ion beam 281 such that ions of the desired species are implanted into workpiece 138. In one instance, the workpiece 138 may be a semiconductor wafer having a disk shape, such as, in one embodiment, a 300 mm diameter silicon wafer. However, the workpiece 138 is not limited to a silicon wafer. The workpiece 138 also could be, for example, a flat panel, solar, or polymer wafer. The end station 211 may include a platen 295 to support the workpiece 138. The end station 211 also may include a scanner (not shown) for moving the workpiece 138 perpendicular to the long dimension of the ion beam 281 cross-section, thereby distributing ions over the entire surface of workpiece 138.

The ion implanter 200 may include additional components known to those skilled in the art such as automated workpiece handling equipment, Faraday sensors, or an electron flood gun. It will be understood to those skilled in the art that the entire path traversed by the ion beam is evacuated during ion implantation. The beam-line ion implanter 200 may incorporate hot or cold implantation of ions in some embodiments.

Solar cell or semiconductor devices have junctions, and therefore require laser melt annealing, at specific areas of the workpiece. For example, different solar cell designs have different doped junction requirements in different areas. Front-side emitters have doped emitters in the whole front side of the solar cell and a back surface field in the whole back side of the solar cell. Selective emitters sometimes have highly-doped regions under the contacts. Back emitters sometimes have a blanket doped emitters in the back side of the solar cell or can have interdigitated doped emitters or other 2D patterns. Other solar cell designs may have other requirements. Absorption of laser energy may be needed at shallow or specific depths in specific areas of the solar cell. In other words, the laser absorption should preferably correspond to the desired junction depth.

For silicon workpieces, laser wavelength absorption may be increased using at least two methods. First, increased dopant density equates to increased laser absorption because the presence of dopants or impurities in silicon changes absorption of lasers. Second, increased amorphization equates to increased laser absorption.

Figure 5:
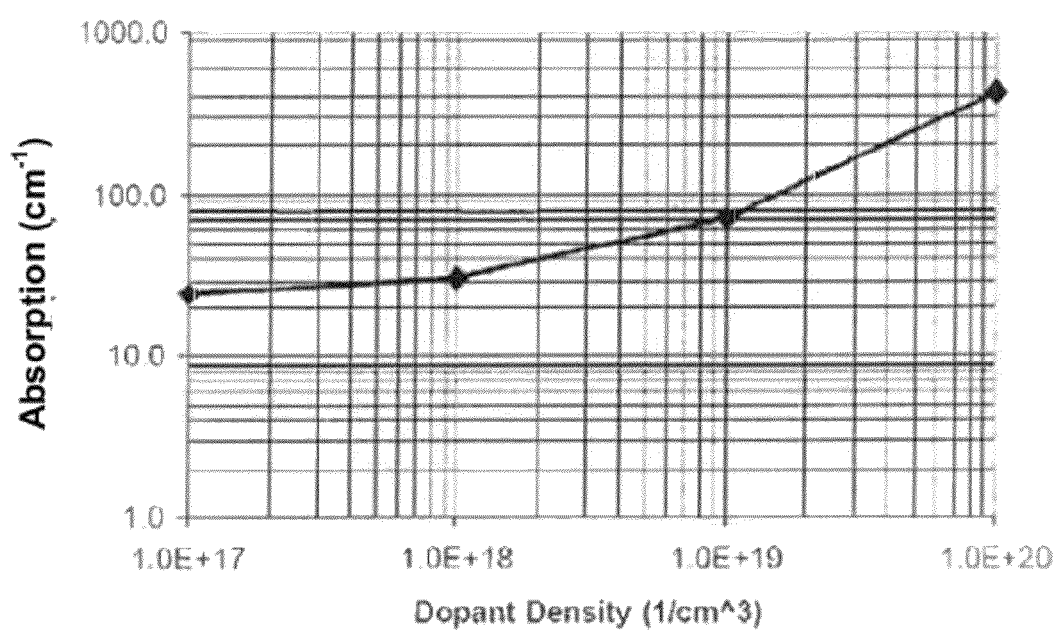
FIG. 5 is a graph illustrating absorption versus dopant density.

For example, the absorption of laser energy at a long wavelength, such as 1.06 μm, in silicon increases with incorporation of boron or phosphorus into the silicon. Of course, other n-type, p-type, or inert dopants may be used. FIG. 5 is a graph showing the absorption of laser energy as a function of dopant concentration. As the dopant concentration increases, the absorption likewise increases. This increase is especially significant at concentrations greater than $1E18$ $cm^{-3}$. For example, the presence of $1E20$ $cm^{-3}$ dopant increases absorption by approximately ten times compared to undoped silicon. This increase in dopant density renders absorption independent to an increase in laser wavelength. Changing dopant density may enable use of cheaper, longer wavelength lasers to anneal a workpiece.

Figure 4:
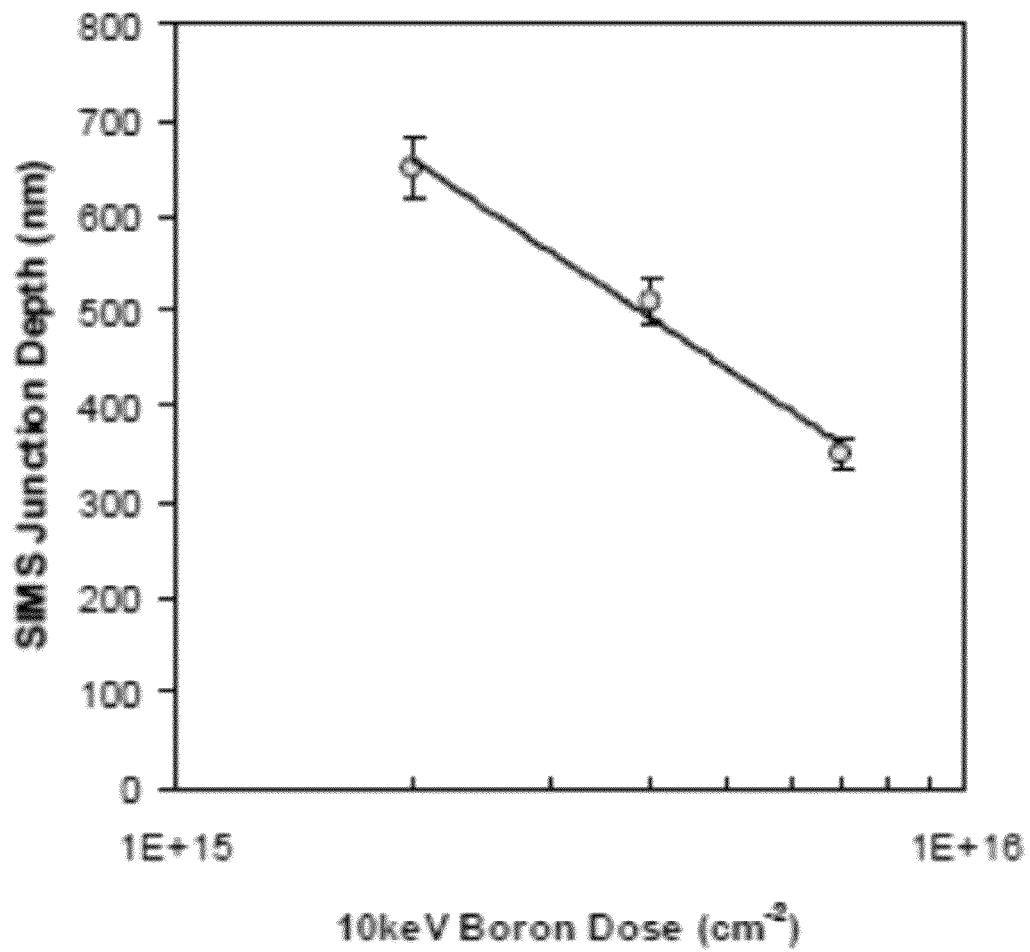
FIG. 4 is a graph illustrating SIMS junction depth versus boron dose.

One way to form shallow junctions is to implant dopants into specific areas of the workpiece using photoresist, an oxide, another hard mask, a stencil mask, a shadow mask, or by altering implant parameters to form a non-uniform dose (scan speed, beam current, etc.). This implant uses a dopant that enables absorption of laser energy within the implanted areas. This implant of dopant of a specific desired concentration creates a melt depth (junction depth) of the desired value that is controlled by the implant range. FIG. 4 is a graph illustrating SIMS junction depth versus boron dose. Melt annealing with the same CW 1.06 μm laser and identical power is used for the embodiment of FIG. 4. Junction depth may be reduced or varied by controlling the dose of the dopant. Implant depth may be controlled by adjusting implant angle, energy, dose, species, or other variables. Implant depth may be used to control junction depth instead of laser parameters in one instance. In one particular embodiment, only the implanted regions of the workpiece absorb the laser energy while the non-implanted regions are transparent to this laser energy. The dopant selected and dose may be tailored to enable particular lasers to be used.

As stated above, amorphization of silicon also may be used to control junction depths. When silicon is amorphized, absorption is increased. Such amorphization may be used to control laser melt anneals. Co-implants of two species, molecular ions, or temperature may be varied to affect the amorphization and, therefore, the junction depth. Amorphization of silicon offers a method to modify the absorption of the laser energy without affecting the final dopant concentration of the workpiece.

Figure 6:
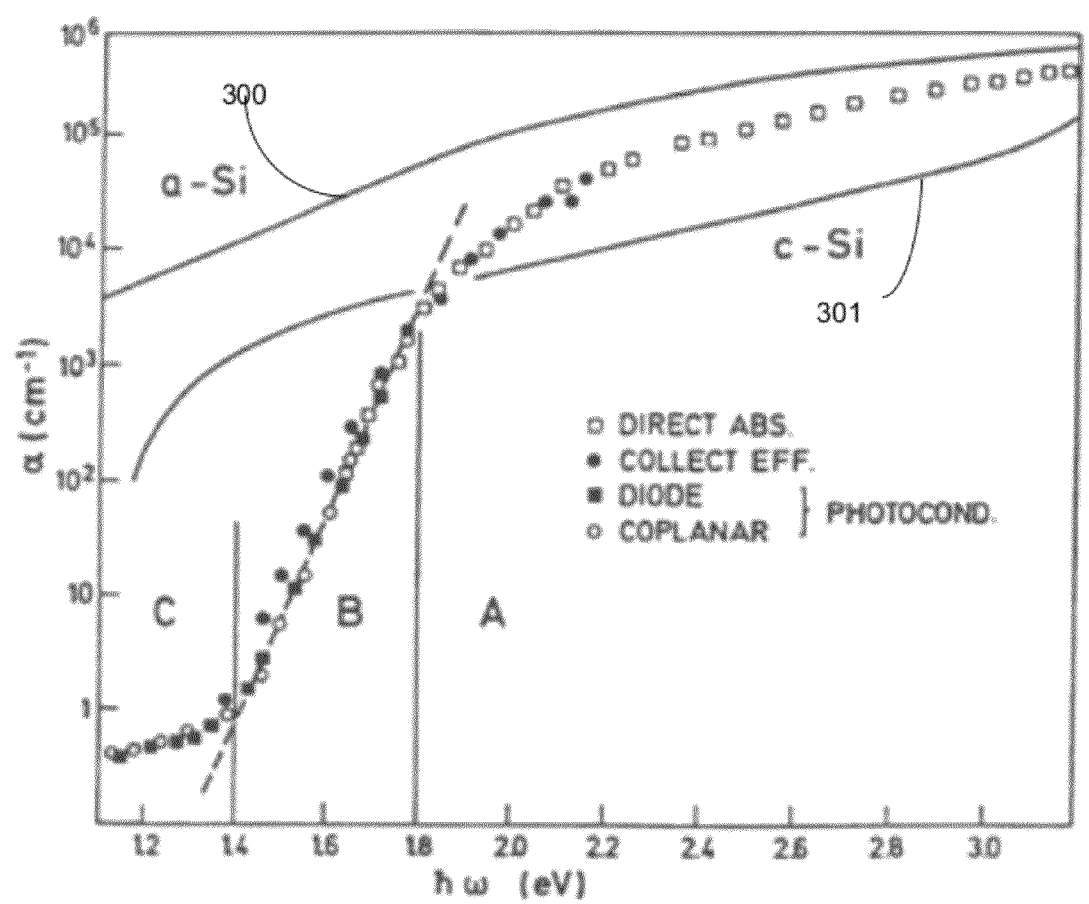
FIG. 6 is a graph showing the relative absorption of amorphous silicon and crystalline silicon.

For example, in some embodiments, a preamorphizing implant is performed, using inert molecules, such as helium. The implantation of helium causes structural damage to the workpiece, thereby destroying its crystalline structure. In some embodiments, this implant is done while the substrate is maintained at cold temperatures, such as below −40° C., which serves to inhibit the regrowth of the silicon crystal. In some embodiments, amorphization of the workpiece may increase absorption by a factor of 10. This enhancement may be due to a combination of a change in optical transparency, and a change in virtual bandgap energy of an amorphized layer. For example, crystalline silicon has a bandgap energy of 1.1 eV, whereas amorphous silicon has a bandgap energy of approximately 1.6 eV. This increase in bandgap energy increases long wavelength light absorption significantly and hence absorption of the longer wavelength lasers. FIG. 6 shows the difference in absorption between amorphous silicon (aSi) 300 and single crystal silicon (cSi) 301. The curves 300, 301 show that amorphous silicon has a higher absorption coefficient as compared to crystalline silicon. An amorphous silicon layer which is amorphized by way of implant will lie between the two curves, 300, 301.

Thus, junction depth can also be controlled by selective amorphization of the workpiece. Implant depth of the amorphizing molecules may be controlled by adjusting implant angle, energy, dose, species, or other variables.

Figure 10A:
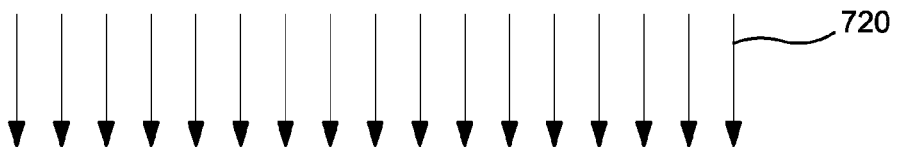
FIGS. 10A-C show a substrate being implanted in accordance with the steps of FIG. 7 to form an emitter region.
Figure 10B:
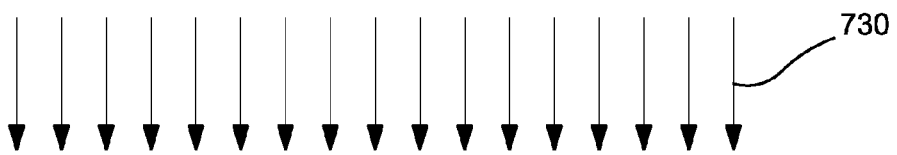
Figure 10C:
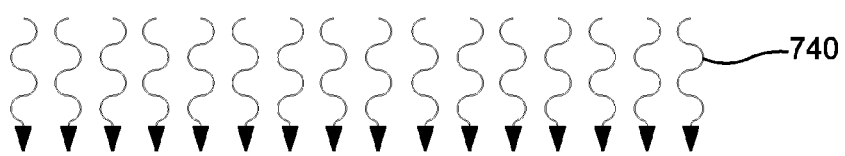

In one example, the following sequence may be used. Note that other sequences are possible, and this example is not intended to limit the scope of the disclosure. For example, as shown in FIGS. 10A-C, assume that a shallow p-type emitter 700 is to be created on the back side of a solar cell 710. These emitter regions 700 may be about 300-600 nm deep.

Figure 7:
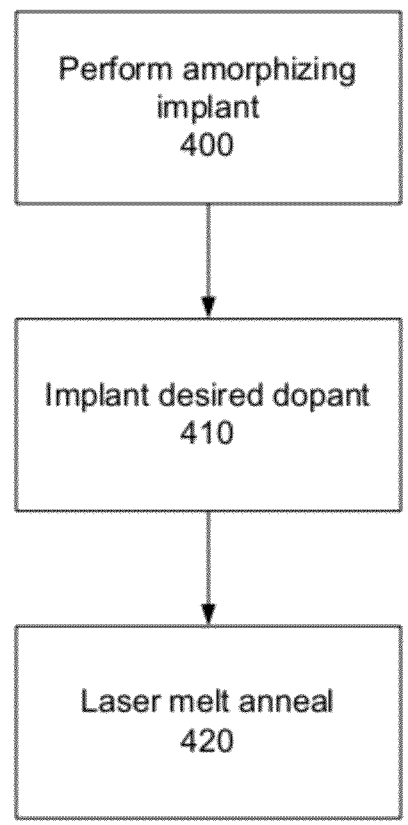
FIG. 7 is a flowchart according to one embodiment.

First, the crystalline structure of the substrate 710 is destroyed through the use of an amorphizing implant 720, as shown in step 400 of FIG. 7 and FIG. 10A. This amorphizing implant 720 is used to increase the absorption of laser energy at longer wavelengths, such as 850 nm or 1060 nm or greater. The amorphizing implant 720 may be done using species, such as inert gasses, Si, Ar or doping species like $BF_2$, $BF_3$, $B_2H_6$, Al, Ga, In. The energy will depend on a desired depth and the species but typically is in the 5-20 keV range. Larger molecules may require higher energies. The doses are also dependent on the species used and the amorphizing threshold. For example, a $BF_2$ dose of $5 \times 10^{14}$ $cm^{-3}$ will amorphize crystalline silicon. To inhibit the substrate 710 from recrystallizing, or to enhance amorphizing, this implant 720 may be performed at cold temperatures, such as less than −40° C.

After the substrate 710 has been amorphized to the desired depth, an implant 730 of the desired dopant, such as boron, may be performed, as shown in step 410 and FIG. 10B. This implant 730 serves two purposes; it provides the desired electrical conductivity in the substrate 710, and further increases the substrates absorption of laser energy. If a species such as $BF_2$, $BF_3$, or $B_2H_6$ is used, the species may serve the purpose of both amorphizing and providing the desired dopant simultaneously. Thus, certain species may perform steps 400 and 410 in a single implant.

After the substrate 710 has been amorphized and doped, the dopant is annealed using a laser melt anneal 740, as shown in step 420 and FIG. 10C. This anneal 740 causes the amorphized region 700 of the substrate 710 to melt, such that the dopant and silicon mix together in liquid form. In some embodiments, laser energy at 1060 nm is used, at an intensity of 1.5 to 4 J/cm2. The substrate 710 then recrystallizes, with the dopant located in the crystalline structure. Thus, the junction is formed at the desired junction depth.

If an n-type emitter or doped layer is desired, species such as P31, $PH_3$, $PF_3$, As, $AsH_3$, or Sb may be used with an appropriate implant energy.

Figure 8:
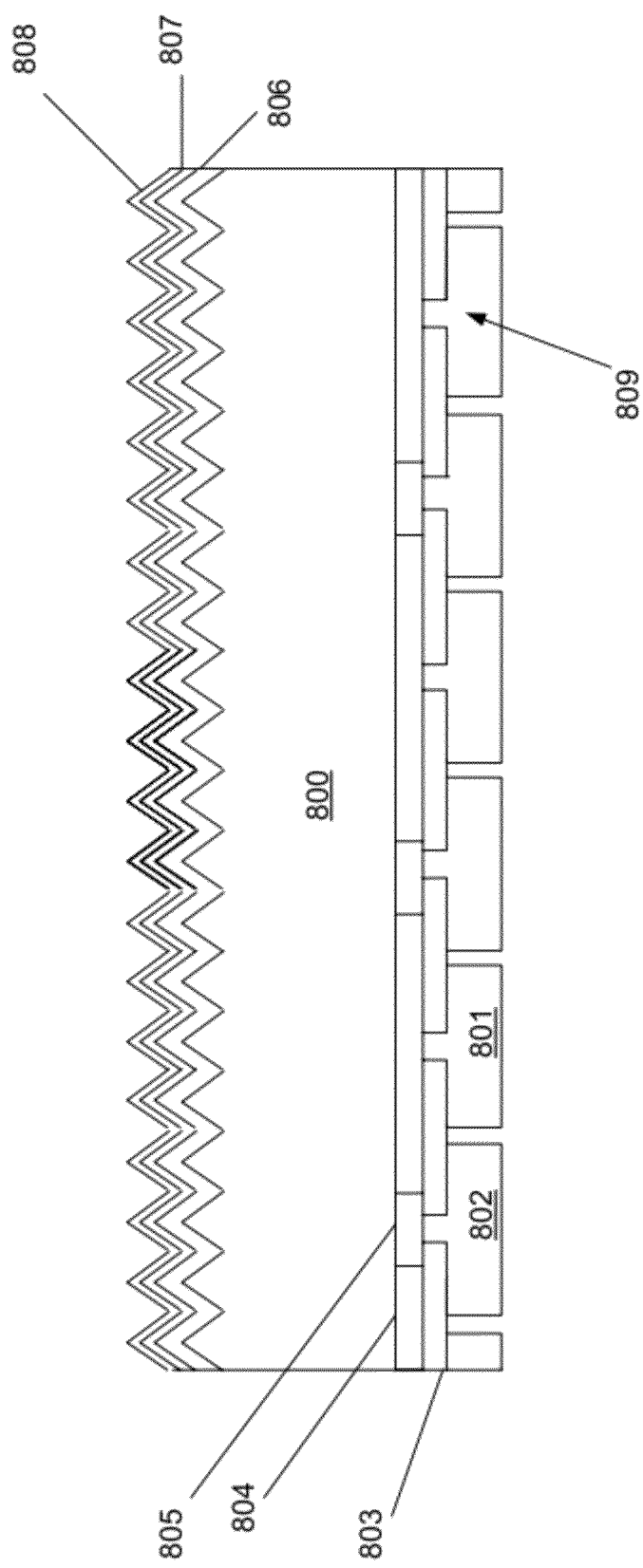
FIG. 8 is a cross section of a IBC solar cell.
Figure 9:
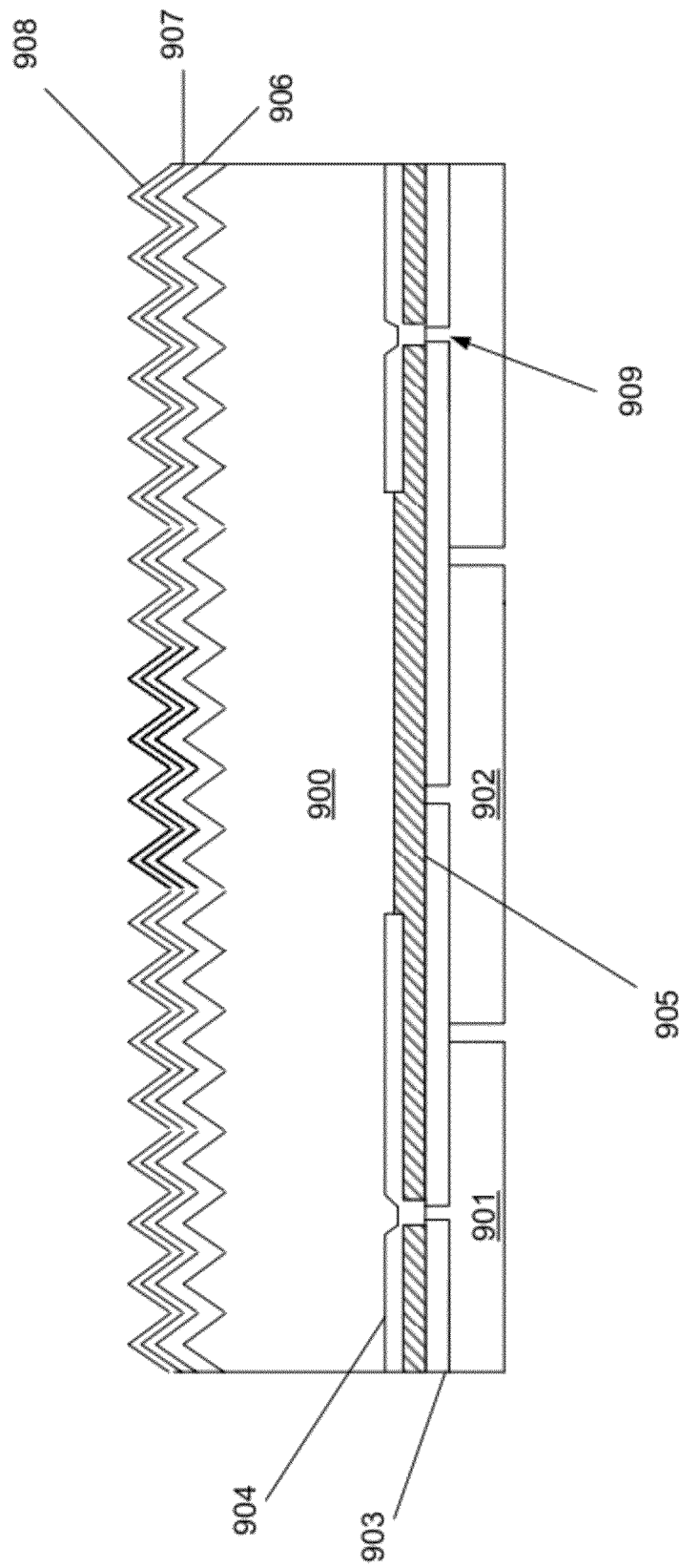
FIG. 9 is a cross section of a buried emitter back contact (BE-IBC) solar cell.

In some solar cell structures, there is a need to have both n and p-type dopants on the same side of the cell and, in some cases, patterned dopant areas are required. These patterned dopant areas may be alternating p-type and n-type dopants in one-dimensional or two-dimensional structures. Examples of such cell structure are the interdigitated back contact cell (IBC) and the buried emitter back contact cell (BE-IMC) Cross-sections of these cells are shown in FIG. 8 and FIG. 9, respectively. In addition, other types of back contact solar cells, such as point back contact solar cells, may also be created using this technique.

FIG. 8 shows an IBC solar cell, where a n-type base 800 is used. On the front side (toward the direction of the solar energy), a random pyramid texture may be applied to maximize surface area. The top surface of the cell includes an antireflective coating 808, a passivating layer 807 and a n+-doped front surface field 806. On the back side, a layer having both n+-doped back surface fields 805 and p+-doped emitters 804 is next to the n-type base 800. A passivating layer 803 is added to this layer. N-type contact fingers 802 and p-type contact fingers 801 are then added. To allow contact between the fingers 801, 802 and the cell, contact holes 809 are introduced in the passivating layer 803.

FIG. 9 shows an BE-IBC solar cell, where a n-type base 900 is used. On the front side (toward the direction of the solar energy), a random pyramid texture may be applied to maximize surface area. The top surface of the cell includes an antireflective coating 908, a passivating layer 907 and a n+-doped front surface field 906. A p-type emitter 904 is buried under a n+-doped back surface field 805. A passivating layer 903 is added to this layer. N-type contact fingers 902 and p-type contact fingers 901 are then added. To allow contact between the fingers 901, 902 and the cell, contact holes 909 are introduced in the passivating layer 903.

In these cases, insitu patterned implants can be performed by utilizing a mask during an ion implant. This creates areas of varying dopant. In addition, the implant creates both amorphized and crystalline areas. Following this type of a patterned implant, a laser melt anneal may be performed. The junction depths formed by a single laser melt across the whole surface will vary based on the amorphization quality and also dopant type in the various patterned areas. These varying junction depths can be beneficial in the cell and could enable additional cell performance enhancements. Optionally, an amorphizing implant may be done as well. The amorphizing implant will serve to improve absorption. In some embodiments, it is preferable to use one implant species that can amorphize and dope at the same time.

In another embodiment when patterned dopant structures are required (such as an IBC or BE-IBC), a blanket implant of one type is followed by a patterned implant of another type, which is then followed by a laser melt anneal. This is referred to as a 'counter-doped laser melt anneal junction'. In one embodiment, a blanket $BF_2$ (p-type) implant of $10^{15}$ $cm^{-3}$ dose is performed. Any other atom or molecule containing a Group III element may be used. This would then be followed by an insitu masked/patterned phosphorous implant of a dose higher than the p-type ($BF_2$) dose. For example, a phosphorous dose of $8 \times 10^{15}$ $cm^{-3}$ may be implanted. Of course, any atom or molecule containing a Group V element may be used. These implants are followed by a laser melt anneal. The areas where there is only p-type ($BF_2$) dopants will recrystallize to grow to become p-type emitters. The areas where there are both p-type ($BF_2$) and n-type (phosphorus) dopants will recrystallize to become n-type back side contact or back surface field. This is due to the n-type (phosphorus) dose being higher than the p-type ($BF_2$) dose in these areas. These 'counter doped laser melt structures' have an advantage that they need only one patterned implant. Furthermore, as the n-type regions have been implanted with both p-type and n-type dopants, these regions may be more amorphous and therefore, may respond differently to the laser anneal. This may cause a slightly different junction depth, for example. Of course, the implants may be performed such that the blanket implant is n-type dopant and the patterned implant is p-type dopant. The order of the blanket and patterned implant may also be changed.

In another embodiment, the implants can be performed on both sides of a solar substrate. These can be laser melt annealed simultaneously or sequentially.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of creating a junction in a region of a substrate, comprising:
    performing an amorphizing implant using a first species to modify absorption characteristics of said region of said substrate;
    implanting ions of a second species into said region of said substrate to alter conductivity of said region and modify said absorption characteristics of said region; and
    performing a laser melt anneal on said region of said substrate, wherein said laser melt anneal utilizes laser energy having a wavelength equal to or greater than 1 µm, and wherein said absorption characteristics of said region are modified such that said region is capable of absorbing said laser energy.

2. The method of claim 1, wherein said substrate is used to create a solar cell.

3. The method of claim 1, wherein said first species is selected from the group consisting of inert gasses, Si, Ar, $BF_2$, $BF_3$, $B_2H_6$, Al, Ga, and In.

4. The method of claim 1, wherein said amorphizing implant and said implanting of said second species are performed simultaneously and first species and said second species comprise the same species.

5. The method of claim 1, wherein said first species is implanted when said substrate is at a temperature less than −40° C.

6. The method of claim 1, wherein said second species is implanted when said substrate is at a temperature less than −40° C.

* * * * *